(12) United States Patent
Suzuki et al.

(10) Patent No.: US 10,032,968 B2
(45) Date of Patent: Jul. 24, 2018

(54) LIGHT EMITTING MODULE, METHOD FOR MANUFACTURING LIGHT EMITTING MODULE, AND VEHICULAR LAMP

(71) Applicant: KOITO MANUFACTURING CO., LTD., Tokyo (JP)

(72) Inventors: Tetsuya Suzuki, Shizuoka (JP); Akihiro Matsumoto, Shizuoka (JP); Tomoyuki Nakagawa, Shizuoka (JP); Naoki Sone, Shizuoka (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 203 days.

(21) Appl. No.: 13/676,187

(22) Filed: Nov. 14, 2012

(65) Prior Publication Data

US 2013/0119431 A1    May 16, 2013

(30) Foreign Application Priority Data

Nov. 15, 2011    (JP) .................................. 2011-249386

(51) Int. Cl.
*H01L 33/00*    (2010.01)
*H01L 33/52*    (2010.01)
*H01L 33/56*    (2010.01)

(52) U.S. Cl.
CPC ............ *H01L 33/52* (2013.01); *H01L 33/005* (2013.01); *H01L 33/56* (2013.01); *H01L 2224/45144* (2013.01); *H01L 2224/48091* (2013.01); *H01L 2933/005* (2013.01)

(58) Field of Classification Search
CPC ...................................... H01L 33/56
USPC ......................................... 257/100, E33.059
See application file for complete search history.

(56) References Cited

U.S. PATENT DOCUMENTS

| | | | |
|---|---|---|---|
| 2009/0302342 A1* | 12/2009 | Kondo et al. .................. | 257/98 |
| 2011/0084299 A1* | 4/2011 | Kotani ............... | H01L 25/0753 257/98 |
| 2011/0175127 A1* | 7/2011 | Kanada .................. | H01L 33/60 257/98 |
| 2011/0255297 A1* | 10/2011 | Belcher ................ | B60Q 1/2665 362/494 |
| 2011/0278605 A1* | 11/2011 | Agatani ............. | H01L 25/0753 257/89 |
| 2013/0113120 A1* | 5/2013 | Tsuruoka ................ | H01L 24/73 257/784 |

FOREIGN PATENT DOCUMENTS

JP    4350617    7/2009

* cited by examiner

*Primary Examiner* — Hsin-Yi Hsieh
(74) *Attorney, Agent, or Firm* — Abelman, Frayne & Schwab

(57) ABSTRACT

Provided is a light emitting module in which an LED device is mounted and power is supplied to the LED device by a gold wire. The light emitting module includes a first resin (sealing material) that seals the gold wire and a second resin (dam wall) that surrounds at least a portion of the outer peripheral of the first resin. The first resin has a lower viscosity and a lower elastic modulus compared to the second resin, and protects the gold wire mechanically and chemically. The second resin suppresses the first resin from being flowed out toward the peripherals, and, as a result, the sealing state of the gold wire by the first resin may be maintained.

12 Claims, 6 Drawing Sheets

LIGHT EMITTING MODULE, METHOD FOR MANUFACTURING LIGHT EMITTING MODULE, AND VEHICULAR LAMP

CROSS-REFERENCE TO RELATED APPLICATIONS

This application is based on and claims priority from Japanese Patent Application No. 2011-249386, filed on Nov. 15, 2011, with the Japanese Patent Office, the disclosure of which is incorporated herein in its entirety by reference.

TECHNICAL FIELD

The present disclosure relates to a light emitting module packaged with a semiconductor light emitting device, and specifically, to a light emitting module in which the reliability of a power supplying unit of the semiconductor light emitting device is improved, a method for manufacturing the light emitting module, and a vehicular lamp using the light emitting module.

BACKGROUND

Recently, head lamps or other lamps using a semiconductor light emitting device such as, for example, a light emitting diode (LED) as a light source, are provided in a vehicle. In such type of lamps, when a semiconductor light emitting device is embedded within a lamp, a light emitting module is constructed such that the semiconductor light emitting device is integrally assembled in a support member and a power supplying unit that supplies power from outside is integrally installed, and the light emitting module is installed within the lamp as a light source. As for such a light emitting module, Japanese Patent No. 4350617 discloses a configuration where an LED unit in which an LED device is mounted on a radiant heat substrate is supported on a light source pedestal, and then the LED unit and the light source pedestal are sandwiched by, for example, a clip to be integrated. Further, a conductive land (contact point) which is electrically connected to the LED device is provided in the radiant heat substrate, a conductive brush (spring terminal) made of an elastic metal is provided in one-side of the light source pedestal, and when the LED unit is supported on the light emitting pedestal, the conductive brush of the light source pedestal is elastically contacted to the conductive land of the LED unit to be electrically contacted to the conductive land, and as a result, an external power is supplied to the LED unit through the light source pedestal.

SUMMARY

In the light emitting module disclosed in Japanese Patent No. 4350617, since the power supplying is performed by the elastic contact between the conductive land of the LED unit and the conductive brush of the light source pedestal, a contact failure may occur by the impacts or the vibrations caused by the driving of a vehicle, and as a result, the conductivity between the conductive land and the conductive brush may be damaged. Furthermore, the conductivity for the conductive land may be deteriorated by an aging characteristic such as the corrosion and the rusting of the conductive brush. The size of the conductive brush may be increased in order to raise the reliability of the conductivity, but the light emitting module has to be enlarged. Therefore, it may be considered that the LED unit and the light source pedestal are electrically connected to each other by a wire bonding using a metal wire. According to the wire bonding, the electric connection between the conductive land and the conductive brush may be ensured. Further, since the space that the metal wire occupies is small, the light emitting module can be effectively miniaturized. However, since the metal wire is very thin and has relatively low mechanical strength, the metal wire may be deformed by external vibrations or impacts, and thus the bonding may be broken or disconnected. Moreover, the impact resistance cannot be improved and the humidity or moisture of the external air may be attached to the metal wire to generate rust, and thus, the durability may be deteriorated. For the reasons, the wire bonding is hard to be applied to the light emitting module for a vehicle.

The present disclosure provides a light emitting module suitable for a light source of a vehicular lamp, in which the reliability of an electric connection by a conductive wire is improved in the light emitting module adopting a wire bonding, a method for manufacturing the light emitting module, and a vehicular lamp using the light emitting module.

The present disclosure provides a light emitting module mounted with a semiconductor light emitting device and power is supplied to the semiconductor light emitting device using a metal wire. The light emitting module includes a first resin that seals the metal wire and a second resin that surrounds at least a portion of the outer circumference of the first resin. Herein, the first resin has a lower viscosity and a lower elastic modulus compared to the second resin. The light emitting module of the present disclosure is configured as a light source of a vehicular lamp.

Further, the present disclosure provides a method for manufacturing a light emitting module mounted with a semiconductor light emitting device and power is supplied to the semiconductor light emitting device using a metal wire. The method includes: forming a dam wall using a second resin in at least a portion of an area that surrounds the metal wire; and filling a first resin having a lower viscosity and a lower elastic modulus than the second resin in an area that is surrounded by the dam wall of the second resin or in an area that is surrounded by a dam wall including a portion of the dam wall of the second resin, thereby sealing the metal wire.

According to the light emitting module of the present disclosure, the metal wire used to supply power to the semiconductor light emitting device is sealed by the first resin, and as a result, an external force is dampened by the first and second resins and is not applied to the metal wire directly. Therefore, the mechanical strength of the metal wire may be increased. Specifically, at least a portion of the outer circumference of the first resin is surrounded by the second resin having a viscosity and an elastic modulus which are relatively higher than the first resin, and thus, the shape of the first resin may be maintained to maintain the sealing state of the metal wire. Further, the metal wire is not exposed to the external air, the occurrence of the corrosion or the rust is suppressed to improve the reliability such as, for example, the durability of the module. The first resin has a lower viscosity, and thus, the metal wire does not deform when the metal wire is sealed. Further, the first resin has a lower elastic modulus, and thus, the metal wire has little influence of the heat stress.

In the method for manufacturing the light emitting module of the present disclosure, the dam wall is formed using the second resin in at least a portion of the area that surrounds the metal wire, and then, the first resin having the lower viscosity and the lower elastic modulus than the second resin is filled in an area which is surrounded by the dam wall of the second resin or in an area which is surrounded by a dam wall including a portion of the dam wall of the second resin in order to seal the metal wire. Therefore, the metal wire may be surely sealed by the first resin having the lower viscosity and the lower elastic modulus, and the light emitting module may be manufactured with the sealing state maintained.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

Figure 1:
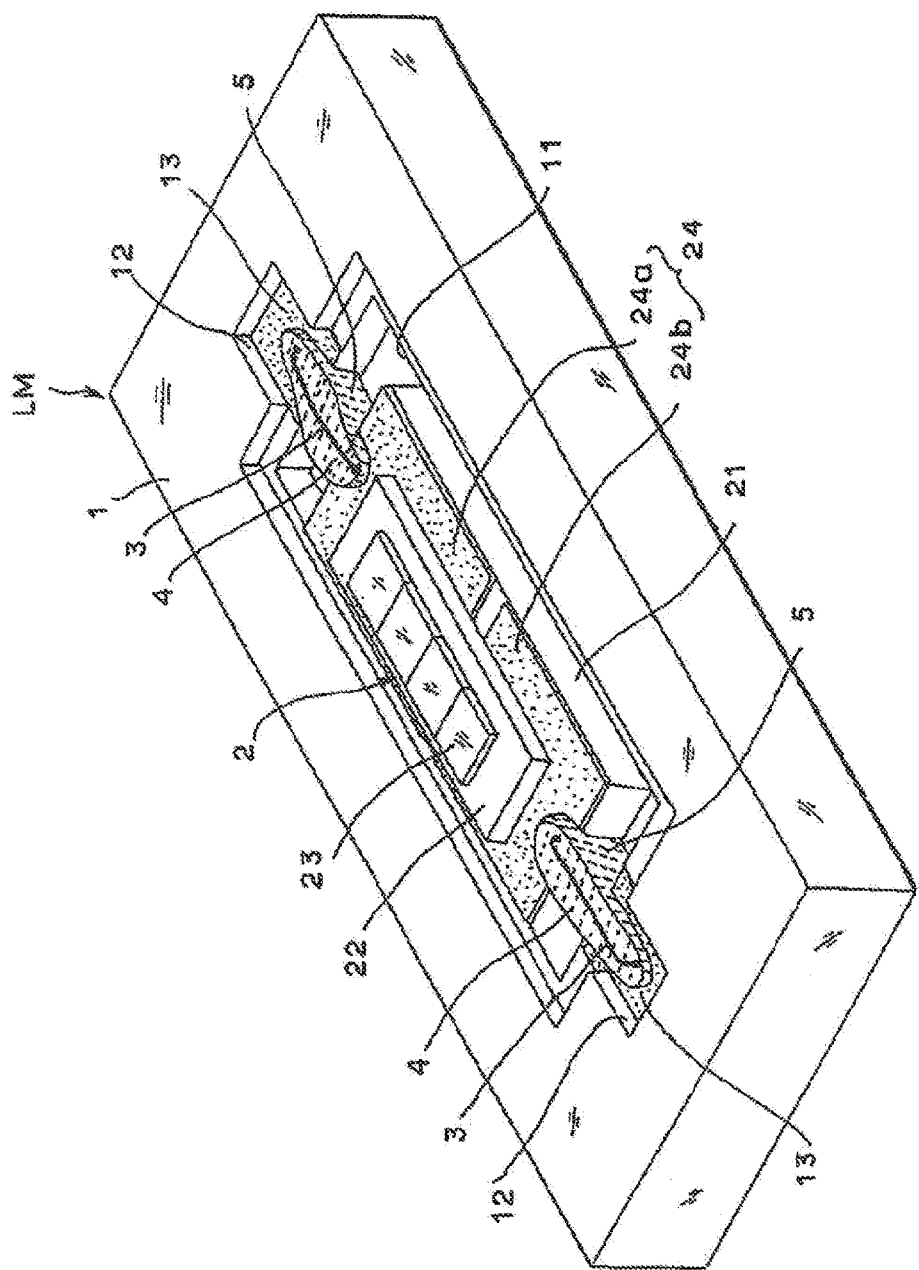
FIG. 1 is an external perspective view illustrating a light emitting module according to an exemplary embodiment of the present disclosure.
Figure 2A:
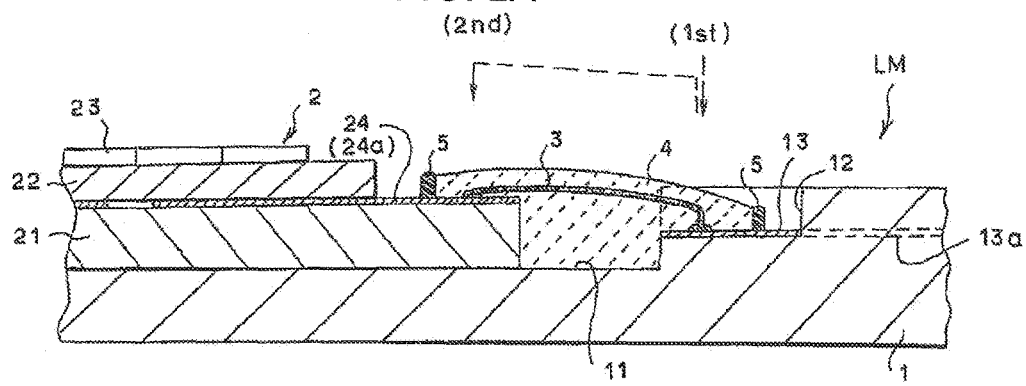
FIGS. 2A and 2B each illustrates a longitudinal cross-sectional view and a referenced longitudinal cross-sectional view illustrating a portion of the light emitting module.
Figure 8:
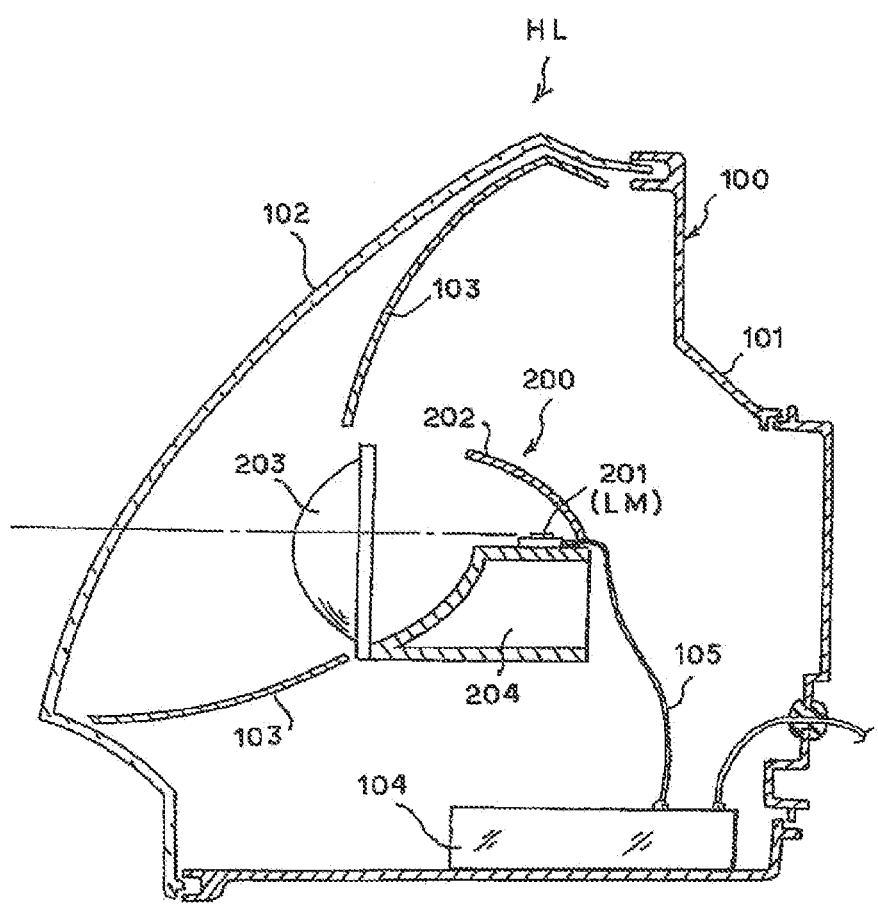
FIG. 8 is a cross-sectional view illustrating an example of a vehicular head lamp using a light emitting module.

Hereinafter, exemplary embodiments of the present disclosure will be described with reference to the drawings. FIG. 1 is an external perspective view where the present disclosure is configured as a light emitting module LM of a vehicular lamp, and FIG. 2A is a longitudinal cross-sectional view of a portion thereof. The vehicular lamp is configured as a vehicular head lamp HL in which a schematic configuration is illustrated in FIG. 8. An analogue reflector (extension) 103 and a turning-ON control circuit 104 as well as a lamp unit 200 are installed within a lamp housing 100 constituted by a lamp body 101 and a front cover 102. The lamp unit 200 includes a reflector 202, which is based on an ellipsoid of revolution, supported on a base body 204, a light source 201 supported on the base body 204 within the reflector 202, and a illuminating lens 203 that illuminates light, which is emitted from the light source 201 and is reflected in the reflector 202, toward the front. A light emitting module LM as illustrated in FIG. 1 is used as the light source 201. The light source 201, that is, the light emitting module LM is connected to the turning-ON control circuit 104 by a power supplying cable 105, and light is emitted by the power supplying from the turning-ON control circuit 104. The turning-ON control circuit 104 is connected to a vehicle-mounted battery (not illustrated).

Figure 2B:
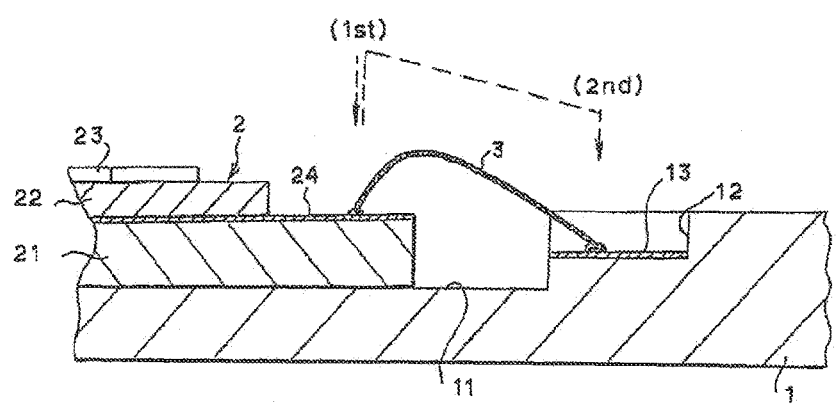

Referring to FIGS. 1, 2A and 2B, the light source unit LM includes a base 1 which is formed in a thick plate form of a rectangular shape as a whole and is made of insulation material such as, for example, a resin, and an embedded concave portion 11 is formed in a rectangular to install a light emitting device unit 2 in a center area of the upper surface of the base 1 as described below. Further, a recess portion 12 in which the upper surface of the base 1 is retracted toward the outer side at a desired shallow depth is provided in both end of the embedded concave portion 11 in the longitudinal direction, and the bottom surface areas of the recess portion 12 are configured as a power supplying land 13. The power supplying land 13 is formed by integrally forming a conductive plate 13a (see, e.g., FIG. 2A) made of a high conductive metal such as, for example, copper when the base 1 is formed, and exposing a portion of the conductive plate 13a embedded in the base 1 at the bottom surface of the recess portion 12. The other portion of the conductive plate 13a, which is not illustrated, extends up to the vicinity of a turning-ON circuit or a connector provided in the base 1 to be connected to the connector or the turning-ON circuit using a conductive wire. The other portion of the conductive plate 13a is connected to the turning-ON control circuit 104 by the power supplying cable 105 through the connector or the turning-ON circuit.

The light emitting device unit 2 is installed in the embedded concave portion 11 of the base 1. The light emitting device unit 2 is configured with a light emitting diode (LED) unit (hereinafter, "LED unit 2"), and includes a radiant heat substrate 21 in a rectangular plate form made of a dielectric inorganic material having a high thermal conductivity, a sub mount 22 mounted in the center area of the upper surface of the radiant heat substrate 21 and formed in a rectangular plate form which is smaller than the radiant heat substrate 21 by one step, and a LED device 23 mounted on the sub mount 22 as a semiconductor light emitting device. The radiant heat substrate 21 is disposed on an inner bottom surface of the embedded concave portion 11 of the base 1, and the bottom surface of the radiant heat substrate 21 is fixed to the inner bottom surface of the embedded concave portion 11 by, for example, a bonding agent. An electrode land 24 formed of a conductive layer in a desired pattern is provided in the upper surface of the radiant heat substrate 21, and is electrically connected to a power supplying land 13 of the base 1 using a wire bonding, as described below. The electrode land 24 is constituted by two electrode lands 24a, 24b which are insulated and separated from each other in the longitudinal direction. One of the electrode lands is configured as a positive electrode land 24a and the other of the electrode lands is configured as a negative electrode land 24b.

The LED device 23 includes four chip-type LED devices which are arranged in series, the upper surface of each of the LED devices 23 is configured as a light emitting surface, and the rear surface thereof is fixed onto the sub mount 22. The sub mount 22 is provided with a desired circuit pattern (not illustrated), and the circuit pattern is electrically connected to each of the positive electrode and the negative electrode of each LED device 23 which is mounted on the sub mount 22. The sub mount 22 is mounted in the upper surface of the radiant heat substrate 21, but the circuit pattern provided on the sub mount 22 is electrically connected to the positive electrode land 24a and the negative electrode land 24b of the radiant heat substrate 21. Therefore, each of the LED devices 23 is electrically connected to the positive electrode land 24a and the negative electrode land 24b of the radiant heat substrate 21 through the sub mount 22, and is applied with a desired current through the electrode land 24 to emit light.

Each of the positive electrode land 24a and the negative electrode land 24b is electrically connected to the power supplying land 13 in the bottom surface of the recess portion 12 provided in both sides of the base 1 in the longitudinal direction, with a wire bonding using a gold (Au) wire 3. So called a ball bonding is adopted as the wire bonding. Herein, a first boning (1st) in which the gold wire 3 is initially connected is performed with respect to the power supplying land 13 of the base 1, and a second bonding (2nd) in which the gold wire 3 is subsequently connected is performed with respect to the electrode land 24 of the LED unit 2. That is, in the exemplary embodiment, as illustrated in FIG. 2A, each electrode land 24 of the LED unit 2 is disposed higher than the power supplying land 13 of the base 1, when the gold wire 3 is wire bonded, a bonding for the power supplying land 13 disposed in the lower position is performed as the first bonding (1st), and a bonding for the electrode land 24 disposed in the higher position is performed as the second bonding (2nd).

As described above, the order of the first bonding (1st) and the second bonding (2nd) of a wire bonding is specified so that a wire loop which occurs in the gold wire 3 when the gold wire 3 extends to the second bonding position after the first bonding (1st), may be suppressed from being upwardly curved, and the height of the gold wire 3 may be lowered than the surface height of the LED device 23. Furthermore, as illustrated in FIG. 2B, if the first bonding (1st) is performed on the electrode land 24, the height of the wire loop of the gold wire 3 is made to be higher than the surface height of the LED device 23 when the second bonding (2nd) is performed using the gold wire 3 on the power supplying land 13 which is in the lower position after first bonding (1st). In the exemplary embodiment, the height of the gold wire 3 may be lowered by specifying the bonding order as described above, and thus, the height dimension of the entire light emitting module LM may be suppressed from being increased to configure a thin film type light emitting module.

In the embedded concave portion 11 and the recess portion 12 of the base 1, a sealing material 4 made of a first resin having a low viscosity and a low elastic modulus is disposed, the peripheral of the sealing material 4 of the first resin is surrounded by a dam wall 5 made of a second resin having a relatively higher viscosity and a relatively higher elastic modulus than the first resin. A silicon gel in which, for example, the elastic modulus is 0.01 MPa to 2 MPa, and the viscosity is about 80 Pas, is used as the first resin, and an epoxy in which, for example, the elastic modulus is 10 GPa to 12 GPa and the viscosity is about 100 Pas to 200 Pas, is used as the second resin. These resins are cured by a heating, but the above-described viscosities are values before curing and the above-described elastic modulus are values after curing.

The dam wall 5 made of the second resin is formed as a cut-less type (a ring type), for example, an ellipse type or a long circle type, which ranges from the embedded concave portion 11 to one of the recess portions 12 of the base 1 so as to surround the peripheral of the gold wire 3. For example, as illustrated in the perspective view in FIG. 3A, a move controllable nozzle N1 moves while the second resin is discharged little by little from the move controllable nozzle N1 as if a loop is drawn along the peripheral of the gold wire 3, and thus a cut-less type wall in which height thereof is low is formed. By repeating it, the second resin may overlaps stepwise in the height direction to form the dam wall 5 of a desired height. The height of the dam wall 5 made of the second resin may be formed in a height which is not higher than the light emitting surface of the LED device 23. Herein, the height of the dam wall 5 is slightly lower than the height of the highest portion of the gold wire 3.

The sealing material 4 made of the first resin is filled in an area surrounded by the dam wall 5 made of the second resin, and the gold wire 3 is sealed in a state where the gold wire 3 is entirely embedded by the first resin. As illustrated in FIG. 3B, the sealing material 4 of the first resin may be used in a potting technology in which the resin is discharged from a nozzle N2. The sealing material 4 discharged from the nozzle N2 is low viscosity, and thus the external force against the gold wire 3 when discharging is reduced to prevent the gold wire 3 from being deformed. The sealing material 4 has a low viscosity, but may be blocked by the dam wall 5 of the second resin. Therefore, the sealing material 4 does not flow out. In the first resin, the height of the central area is higher than the height of the peripheral area by the surface tension thereof, and thus, even though the height of the dam wall 5 of the second resin is lower than the height of the gold wire 3, the gold wire 3 may be entirely sealed. When the gold wire 3 is sealed in this way, the first resin is formed in a height which is not higher than the light emitting surface of the LED device 23. Specifically, in the gold wire 3, the first bonding (1st) is performed on the power supplying land 13 of the base 1 as described above, and thus, the height of wire loop thereof is suppressed to become lowered than the height of the light emitting surface of the LED device 23. Therefore, the height of the sealing material 4 made of the first resin may surely be lowered than the height of the light emitting surface.

According to the light emitting module LM, when the module LM is disposed within a head lamp as the light source 201 of the head lamp HL for a vehicle as illustrated in FIG. 8, the power supplying land 13 provided on the base 1 becomes in a state where the power supplying land 13 is electrically connected to the turning-ON control circuit 104, as described above. Accordingly, power is supplied up to the electrode land 24 (the positive electrode land 24a and the negative electrode land 24b) provided on the radiant heat substrate 21 which is connected to the power supplying land 13 using the gold wire 3, and each of the four LED devices 23 connected to the electrode land 24 through the sub mount 22 receives the power to emit light.

When or after the light emitting module LM is disposed in the head lamp HL for a vehicle, even though various external forces are applied to the light emitting module LM by external factors, the power supplying land 13 of the base 1 and the electrode land 24 of the LED unit 2 are electrically connected to each other by the gold wire 3, and thus, the contact failure generated in a configuration where the land 13 and the land 24 are contacted using the conductive brush as in Patent document 1 may be prevented. Therefore, a large sized conductive brush may not be used in order to secure the conductivity, and thus, the light emitting module LM may be miniaturized. The gold wire 3 is physically sealed while the peripheral thereof is surrounded by the sealing material 4 made of the first resin, and thus, no external force is directly applied to the gold wire 3. Further, the gold wire 3 is sealed air-tightly and liquid-tightly by the sealing material 4, and thus, the humidity or the moisture of external air does not influence on the gold wire 3, and the corrosion or the rust may be prevented from being generated to improve the reliability. Even when heat is transferred to the sealing material 4, the first resin constituting the sealing material 4 has a low elastic modulus, and thus, the sealing material 4 itself may be deformed, the heat stress applied to the gold wire 3 may be small, and further, the deformation of the gold wire 3 or the separation of the gold wire 3 from the power supplying land 13 may be prevented.

Even though the sealing material 4 made of the first resin and the dam wall 5 made of the second resin are formed to seal the gold wire 3, the resins are disposed only the inside of the embedded concave portion 11 and the recess portion 12 of the base 1, and thus, the outer dimensions of the light emitting module LM is not enlarged, and no obstacle against the miniaturization of the light emitting module LM occurs. The sealing material 4 is formed in a lowest height to seal the gold wire 3, the dam wall 5 is formed in a required height to suppress the sealing material 4 from being flowed out to the outside, and the both of the sealing material 4 and the dam wall 5 have the height which are not higher than the light emitting surface of the LED device 23. Therefore, among the emitted lights from the LED device 23, the light emitted in the horizontal direction is not blocked by the sealing material 4 or the dam wall 5, and a light emitting module LM having a large emitting angle of light may be realized. Accordingly, a light emitting module LM having a high generality may be configured as a light source of a vehicular lamp in which various light distribution characteristics are required.

Figure 4:
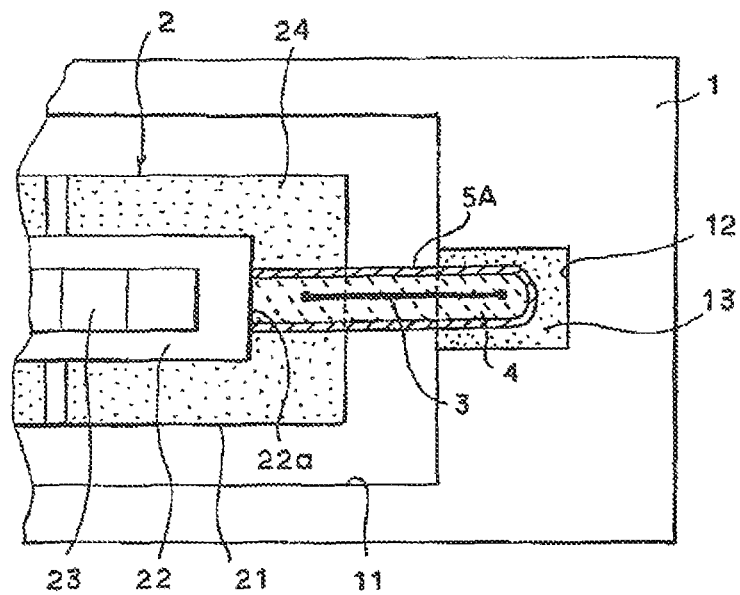
FIG. 4 is a plan view illustrating a modified example 1 of the dam wall and the sealing material.

In the exemplary embodiment as described above, the dam wall 5 of the second resin is formed in an ellipse type or a long circle type to surround the entire peripheral of the gold wire 3. However, the dam wall 5 is used to suppress the sealing material 4 from being flowed out toward the peripheral, and thus, the dam wall 5 made of the second resin may not be formed over the entire peripheral of the gold wire 3. For example, as illustrated in a plan view of a modified example 1 in FIG. 4, an end surface 22a of the sub mount 22 in the longitudinal direction is configured as a portion of a dam wall, a dam wall 5A of the second resin is formed in an area except the end surface 22a, and the gold wire 3 is surrounded by the dam wall constituted by the end surface 22a and the dam wall 5A made of the second resin, and thus, the sealing material 4 made of the first resin may be filled in the surrounded area.

Figure 5:
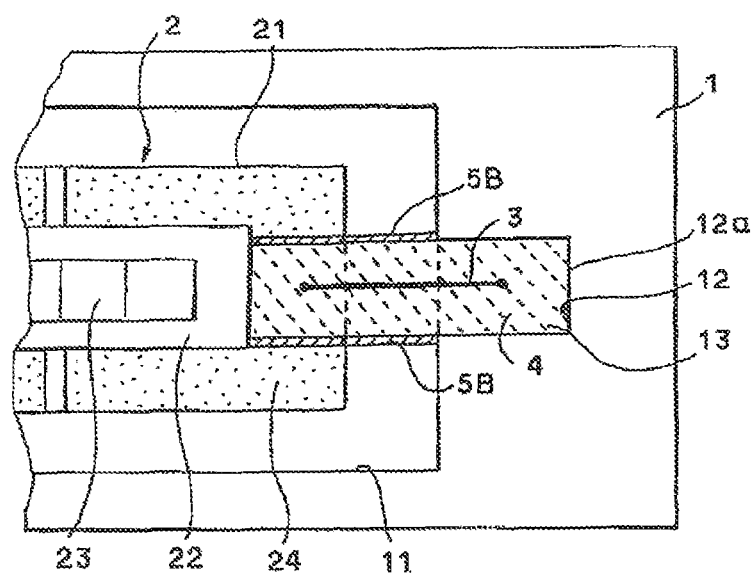
FIG. 5 is a plan view illustrating a modified example 2 of the dam wall and the sealing material.

Otherwise, as illustrated in a plan view of a modified example 2 in FIG. 5, each of the end surface 22a of the sub mount 22 in the longitudinal direction and the inner side surface 12a having a "⏋" shape of Japanese character that faces toward the recess portion 12 of the base 1 is configured as a portion of a dam wall, a dam wall 5B of the second resin is formed in an area except the end surface 22a and the inner side surface 12a. And the gold wire 3 is surrounded by the dam wall constituted by the end surface 22a and the inner side surface 12a, and by the dam wall 5B made of the second resin, and thus, the sealing material 4 made of the first resin may be filled in the surrounded area.

Figure 6:
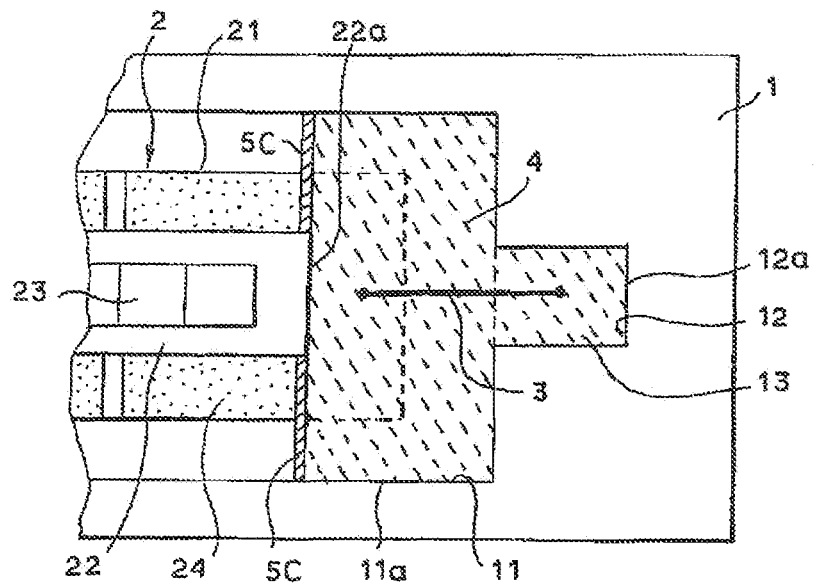
FIG. 6 is a plan view illustrating a modified example 3 of the dam wall and the sealing material.

Furthermore, as illustrated in a plan view of a modified example 3 in FIG. 6, each of the end surface 22a of the sub mount 22, an inner side surface 11a of the embedded concave portion 11 and the inner side surface 12a directed toward the recess portion 12 of the base 1 may be configured as a portion of a dam wall. Also, a dam wall 5C of the second resin may be formed only in an area where the end surface 22a and the inner side surfaces 11a, 12a do not exist to surround the gold wire 3, and thus, the sealing material 4 made of the first resin may be filled in the surrounded area.

Figure 7:
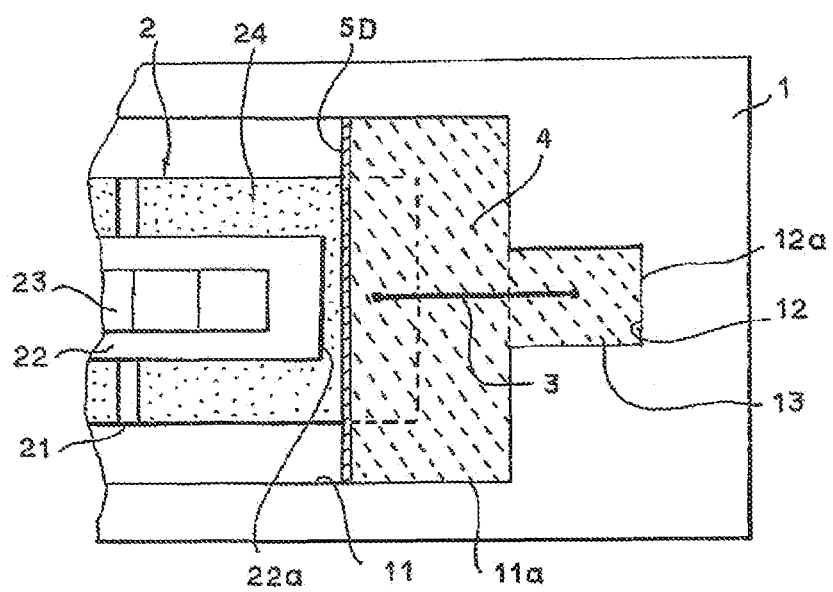
FIG. 7 is a plan view illustrating a modified example 4 of the dam wall and the sealing material.

In the above-described case, as illustrated in a plan view of a modified example 4 in FIG. 7, the end surface 22a of the sub mount 22 is not used as a dam wall, only each of the inner side surface 11a of the embedded concave portion 11 and the inner side surface 12a directed toward the recess portion 12 of the base 1 may be configured as a portion of a dam wall, a dam wall 5D of the second resin may be formed across the entire width of the embedded concave portion 11 at a position opposite to the inner side surfaces 11a, 12a to surround the gold wire 3, and thus, the sealing material 4 made of the first resin may be filled in the surrounded area.

Figure 3A:
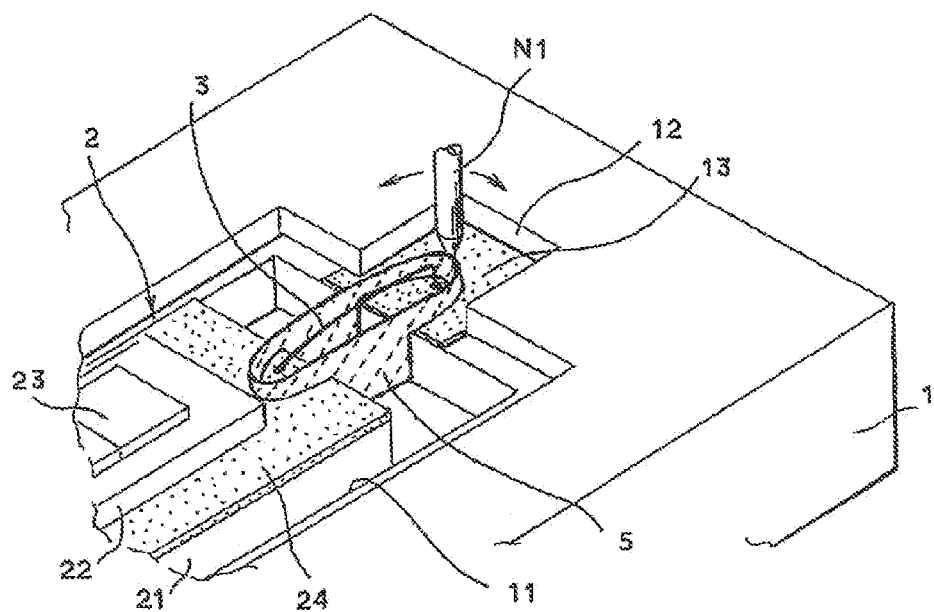
FIGS. 3A and 3B each illustrates external views for describing the manufacturing processes of a sealing material (first resin) and a dam wall (second resin).
Figure 3B:
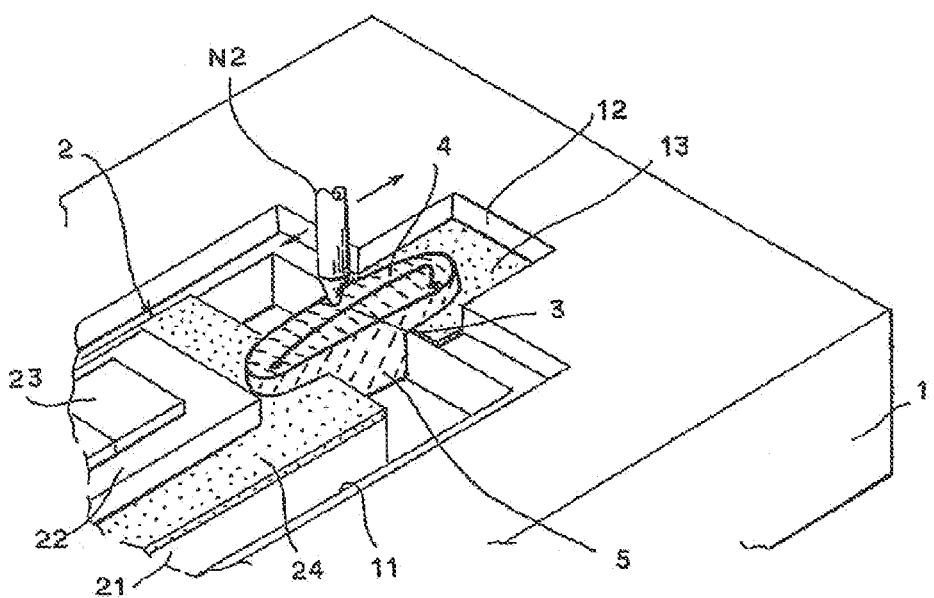

Herein, in the forming of the dam wall 5 (5A to 5D) by the second resin, in addition to the method in which the nozzle N1 moves as illustrated in FIG. 3A, a method may be adopted where a mold form including an inner frame and an outer frame on the upper surface side of the base 1 is disposed and the second resin is injected into the mold form to form a dam wall 5. In such a case using the mold form, in a state where only the inner frame is removed before the dam wall 5 is fully cured and the outer frame is remained to maintain the shape of the dam wall 5, the first resin may be filled to seal the gold wire 3 by the sealing material 4. In the case, the filling with the sealing material 4 needs not to be waited until the dam wall 5 is cured, and the curing of the sealing material 4 and the curing of the dam wall 5 may be waited concurrently, and thus, it may be effective for the shortening of the manufacturing time.

Further, in the exemplary embodiments, the gold wire 3 is connected to the electrode land 24 and the power supplying land 13 with a ball bonding, but a wedge bonding using an ultrasonic wave may be used as well. Specifically, the wedge bonding makes the height that lifts the gold wire 3 upwardly to be lowered to further lower the height of the wire loop generated in the gold wire 3, and thus the height of the sealing material 4 and the dam wall 5 can be lowered as much as possible to miniaturize the light emitting module.

In the exemplary embodiments, an LED device is used for the semiconductor light emitting device to configure the light emitting module, but the semiconductor light emitting device may be a laser diode or other light emitting device. Further, in the exemplary embodiments, the semiconductor light emitting device is mounted on the sub mount, but the sub mount may be omitted, and for example, the semiconductor light emitting device may be directly mounted on the surface of the radiant heat substrate.

The present disclosure may be adopted in a light emitting module in which a semiconductor light emitting device is mounted and the power is supplied to the semiconductor light emitting device by a wire bonding.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A light emitting module comprising:
   a base, on which is provided a radiant heat substrate and a power supplying land, the radiant heat substrate and the power supplying land being physically separated from each other;
   an electrode land is provided on the radiant heat substrate, with a light emitting device being mounted on the electrode land;
   a metal wire with a first end and a second end, the first end being connected to the power supplying land and the second end being connected to the electrode land, the metal wire being configured to supply power from the power supplying land to the light emitting device via the electrode land;

a first resin configured to seal the metal wire in its entirety; and a second resin configured to surround at least a portion of an outer peripheral of the first resin, thereby forming a dam wall for the first resin and enabling the first resin to maintain its shape for the metal wire, wherein neither the first resin nor the second resin directly contacts the light emitting device, and the first resin has a viscosity of about 80 Pas and a height of a highest point of the second resin is made to be lower than a height of a highest point of the metal wire.

2. The light emitting module of claim 1, wherein the first resin has a lower viscosity before curing and a lower elastic modulus after curing compared to the second resin.

3. A vehicular lamp comprising a light source configured by the light emitting module of claim 1.

4. A vehicular lamp comprising a light source configured by the light emitting module of claim 2.

5. The light emitting module of claim 1, wherein the dam wall is formed as a cut-less type.

6. The light emitting module of claim 1, wherein the first resin is formed in a height not higher than a light emitting surface of the light emitting device.

7. The light emitting module of claim 1, wherein the first resin is a silicon gel.

8. The light emitting module of claim 1, wherein the second resin is an epoxy.

9. The light emitting module of claim 1, wherein an elastic modulus of the first resin ranges from 0.01 MPa to 2 MPa.

10. The light emitting module of claim 1, wherein an elastic modulus of the second resin ranges from 10 GPa to 12 GPa, and a viscosity of the second resin ranges from 100 Pas to 200 Pas.

11. The light emitting module of claim 1, wherein the dam wall is formed as a long circle type.

12. The light emitting module of claim 1, further comprising a sub mount provided between the light emitting device and the electrode land, wherein the configuration of the metal wire to supply power from the power supplying land to the light emitting device via the electrode land further comprises supplying power through the sub mount.

* * * * *